(12) United States Patent
Fasano

(10) Patent No.: US 10,236,145 B1
(45) Date of Patent: Mar. 19, 2019

(54) HIGH VOLTAGE DC CIRCUIT BREAKER WITH DOUBLE BREAK CONTACTS

(71) Applicant: Carling Technologies, Inc., Plainville, CT (US)

(72) Inventor: Michael Fasano, Watertown, CT (US)

(73) Assignee: Carling Technologies, Inc., Plainville, CT (US)

(*) Notice: Subject to any disclaimer, the term of this patent is extended or adjusted under 35 U.S.C. 154(b) by 0 days.

(21) Appl. No.: 15/821,550

(22) Filed: Nov. 22, 2017

(51) Int. Cl.
*H01H 33/08* (2006.01)
*H01H 33/02* (2006.01)
*G01R 19/165* (2006.01)

(52) U.S. Cl.
CPC ........ *H01H 33/08* (2013.01); *G01R 19/16571* (2013.01); *H01H 33/025* (2013.01)

(58) Field of Classification Search
CPC ........ H01H 33/08; H01H 33/025; H01H 9/30; H01H 9/345; H01H 9/36; H01H 9/38; H01H 9/40; H01H 9/443; H01H 33/596; H01H 9/34; H01H 71/02; G01R 19/16571
USPC ............... 218/149, 15, 34, 46, 76, 103, 107, 218/154–156, 26; 200/238, 48 R, 293; 335/201
See application file for complete search history.

(56) References Cited

U.S. PATENT DOCUMENTS

| | | | | |
|---|---|---|---|---|
| 6,326,868 B1* | 12/2001 | Kranz | ..................... | H01H 1/205 335/8 |
| 7,417,520 B2* | 8/2008 | Kralik | ..................... | H01H 9/34 335/201 |
| 8,222,983 B2* | 7/2012 | Zhou | ..................... | H01H 9/443 335/201 |
| 8,368,492 B1* | 2/2013 | Theisen | ................... | H01H 9/36 335/201 |
| 8,822,862 B2* | 9/2014 | Cyuzawa | ................. | H01H 1/66 200/405 |
| 8,937,519 B2* | 1/2015 | Gerving | ................... | H01H 1/20 335/201 |
| 9,552,944 B2* | 1/2017 | Baujan | ................. | H01H 33/182 |
| 2004/0051605 A1* | 3/2004 | Fasano | ................... | H01H 9/443 335/35 |

FOREIGN PATENT DOCUMENTS

EP 1205958 * 5/2002 ............. H01H 71/10

OTHER PUBLICATIONS

Translation of EP1205958 (original doc. published May 15, 2002).*

* cited by examiner

*Primary Examiner* — Edwin A. Leon
*Assistant Examiner* — William A Bolton
(74) *Attorney, Agent, or Firm* — Forge IP, PLLC

(57) ABSTRACT

A high voltage DC circuit interrupter that is provided with a double break contact where each contact is provided with an arc chamber. The double break contacts are provided in series with each other and an overcurrent measurement device such that if an overcurrent is measured, the contacts are simultaneously opened (i.e., double break) to lower the voltage that is developed across each of the sets of contacts. A handle is provided for simultaneously resetting and closing the sets of contacts.

42 Claims, 3 Drawing Sheets

HIGH VOLTAGE DC CIRCUIT BREAKER WITH DOUBLE BREAK CONTACTS

FIELD OF THE INVENTION

The invention relates to a circuit interrupter used for high voltage applications, and more specifically, the invention relates to a circuit interrupter with a double break contact where each contact is provided with an arc chamber.

BACKGROUND OF THE INVENTION

Circuit interrupters are electrical components that are used to open an electrical circuit, interrupting the flow of current. A basic example of a circuit interrupter is a switch, which generally consists of two electrical contacts in one of two states; either closed, meaning that the contacts are in electrical contact with each other allowing electricity to flow between them, or open, meaning that the contacts are not in electrical contact with each other preventing the flow of electricity. A switch may be directly manipulated to provide a control signal to a system, such as a computer keyboard button, or to control power flow in a circuit, such as a light switch.

Another example of a circuit interrupter is a circuit breaker. A circuit breaker is designed to protect an electrical circuit from damage caused by, for example, an overload, a ground fault or a short circuit. If a fault condition, such as a power surge occurs in the electrical wiring, the breaker will trip. This will cause a breaker that was in an "on" position to flip to an "off" position and interrupt the flow of electrical power through the breaker. Circuit breakers are generally provided to protect the electrical wiring by limiting the amount of current transmitted through the wires to a level that will not damage them. Circuit breakers can also prevent destruction of the devices that may draw too much current.

A standard circuit breaker has a first terminal connected to a source of electrical power, and a second terminal electrically connected to the wires that the breaker is intended to protect. Conventionally, these terminals are referred to as the "line" and "load", respectively. The line is sometimes referred to as the input of the circuit breaker. The load is sometimes referred to as the output of the circuit breaker, which connects to the electrical circuit and components receiving the electrical power.

A circuit breaker can be used as a replacement for a fuse. Unlike a fuse, however, which typically operates to open in an over current situation and then must be replaced; a circuit breaker can be "reset" (either manually or automatically) to resume operation. Fuses perform a similar role to circuit breakers, however, circuit breakers are easier to use and typically safer to service and operate.

Unlike the situation when a fuse blows, when a circuit breaker trips, it is relatively easy to determine which circuit breaker feeds the interrupted circuit by looking at the electrical panel and noting which breaker has a handle in the "tripped" position. This breaker can then be simply moved to the "off" position (which resets the circuit breaker), and then moved to the "on" position and power will resume.

In general, a single pole circuit interrupter has at least two contacts positioned inside of a housing. The first contact is stationary and may be connected to either the line or the load. The second contact is movable with respect to the first contact, such that when the circuit breaker is in the "off" or "tripped" position, a gap exists between the first and second contact.

In high voltage applications, the opening and closing of contacts, can result in an arc developing between the contacts. High voltage applications typically are associated with high power transfer and therefore, the switching devices used in these applications must be able to effectively and safely switch even under load.

A problem with the above-described circuit interrupters arises when energized contacts are opened while under load. As the contacts separate, an electric arc may be formed in the gap between the contacts. An electrical arc is a plasma discharge between two points that is caused by electrical current that ionizes gasses in the air between the two points.

The creation of an arc during transition of the contacts can result in undesirable effects that negatively affect the operation of the circuit interrupter, even potentially creating a safety hazard. These negative effects can also have adverse consequences on the functioning of the circuit interrupter.

One possible consequence is that the arc may short to objects inside the circuit interrupter and/or to surrounding objects, causing damage and presenting a potential fire or safety hazard.

Another consequence of arcing is that the arc energy damages the contacts themselves, causing some material to escape into the air as fine particulate matter. The debris that has been melted off of the contacts can migrate or be flung into the mechanism of the circuit interrupter, destroying the mechanism or reducing its operational lifespan.

Still another effect of arcing is due to the extremely high temperature of the arc (tens of thousands of degrees Celsius), which can impact the surrounding gas molecules creating ozone, carbon monoxide, and other dangerous compounds. The arc can also ionize surrounding gasses, potentially creating alternate conduction paths.

The challenges faced in high voltage applications is further complicated with Direct Current (DC) applications as there is no zero voltage crossing. In Alternating Current (AC) applications, opening of the contacts can be timed to correspond with the zero voltage crossing to minimize potential arcing. However, in DC applications there is no zero voltage crossing; therefore switching must quite often happen at peak voltage under load.

It is therefore desired to provide a circuit interrupter usable in DC applications that overcomes the above-described limitations.

SUMMARY OF THE INVENTION

Accordingly, it is an object of the present invention to provide a circuit interrupter for use in high voltage applications having an arc extinguisher that functions to arrest an arc between the circuit interrupter contacts.

It is a further object of the present invention to provide a circuit interrupter for use in high voltage applications that is designed to minimize the formation of arcs when the contacts are opening or closing.

It is a further object of the present invention to provide a circuit interrupter for use in high voltage applications that is adapted to minimize arc formation and if and arc does form, will quickly function to extinguish the arc.

These and other objectives are achieved by providing a circuit interrupter that includes a first moveable contact and a second stationary contact (a first set of contacts). The first stationary contact is positioned on a first stationary contact arm that is elongated and generally flat and connected to a first terminal. A first moveable contact arm is also provided that has a first moveable contact mounted thereon. The first moveable contact arm is adapted to be moved such that the first movable contact moves into and out of contact with the first stationary contact.

In one configuration, the first movable contact is coupled to a first flexible conductor that is coupled to an input to an overcurrent measurement device. The output of the overcurrent measurement device is in turn, coupled to a second flexible conductor that is coupled to a second moveable contact. The second moveable contact is positioned on a second moveable contact arm. Also provided is a second stationary contact mounted on a second stationary contact arm. The second moveable contact and the second stationary contact (a second set of contacts) are adapted to be moved into and out of physical contact with each other. The second stationary contact is further connected to a second terminal.

Also provided in one configuration is a first arc extinguisher that is positioned in the vicinity of the first moveable and first stationary contacts. The first arc extinguisher is provided such that when an arc develops between the first movable and first stationary contacts, the arc is then drawn into the first arc extinguisher. Likewise, a second arc extinguisher is provided in the vicinity of the second moveable and second stationary contacts such that, if an arc develops between the second movable and second stationary contacts, the arc is drawn into the second arc extinguisher.

The circuit interrupter may further be provided with a housing within, which the working parts of the circuit interrupter are maintained. In one configuration, the first moveable contact arm is connected to a first linkage that is coupled to a handle that extends out a top side of the housing. The first linkage is provided such that, if the handle is moved to the Off position, this will function to move the first linkage to open the first and the second contacts. Alternatively, if the overcurrent measurement device detects an overcurrent condition, the overcurrent measurement device can function to move the first linkage to open the first and the second contacts.

The circuit interrupter is further provided with a second linkage that is coupled to the handle and to the second moveable contact arm. The second linkage is provided such that, if the handle is moved to the Off position, this will function to move the second linkage to open the second set of contacts.

In a further configuration, the circuit interrupter is provided with a single handle that is used to actuate both the first and second linkages such that the first set of contacts and the second set of contacts are opened and closed simultaneously.

As can be seen from the above description, the circuit interrupter is provided with a first set of contacts in series with a second set of contacts that are actuated simultaneously. This is advantageous for high voltage applications as the voltage developed across each of the individual sets of contacts will be equal to one half of the total voltage of the applied voltage. By splitting the voltage across two sets of contacts in series with each other, this functions to lower the arcing that will occur across each of the sets of contacts.

For this application the following terms and definitions shall apply:

The terms "first" and "second" are used to distinguish one element, set, data, object or thing from another, and are not used to designate relative position or arrangement in time.

The terms "coupled", "coupled to", "coupled with", "connected", "connected to", and "connected with" as used herein each mean a relationship between or among two or more devices, apparatus, files, programs, applications, media, components, networks, systems, subsystems, and/or means, constituting any one or more of (a) a connection, whether direct or through one or more other devices, apparatus, files, programs, applications, media, components, networks, systems, subsystems, or means, (b) a communications relationship, whether direct or through one or more other devices, apparatus, files, programs, applications, media, components, networks, systems, subsystems, or means, and/or (c) a functional relationship in which the operation of any one or more devices, apparatus, files, programs, applications, media, components, networks, systems, subsystems, or means depends, in whole or in part, on the operation of any one or more others thereof.

The term "high" voltage is applied to applications in which a voltage higher than that used for power distribution. The lower limit is typically taken as 8,700V according to the National Electrical Safety Code (NFPA 70).

In one configuration of the system, a high voltage DC circuit interrupter is provided comprising a first stationary contact and a first moveable contact forming a first set of contacts, a first moveable contact arm having the first moveable contact positioned thereon, the first moveable contact adapted to be moved into and out of contact with the first stationary contact, and a first linkage coupled to the first moveable contact arm. The circuit interrupter further comprises a second stationary contact and a second moveable contact forming a second set of contacts, a second moveable contact arm having the second moveable contact positioned thereon, the second moveable contact adapted to be moved into and out of contact with the second stationary contact, and a second linkage coupled to the second moveable contact arm. The circuit interrupter also comprises an overcurrent measurement device coupled in series with the first and second sets of contacts and a handle coupled to the overcurrent measurement device and positioned in an upper side of a housing. The circuit interrupter is provided such that the overcurrent measurement device is adapted to actuate the first and second linkages in an overcurrent condition so that both the first and second sets of contacts are simultaneously opened during an overcurrent condition.

In another configuration of the system, a high voltage DC circuit interrupter is provided comprising a first stationary contact and a first moveable contact forming a first set of contacts, the first moveable contact positioned on a first moveable contact arm and adapted to be moved into and out of contact with the first stationary contact. The circuit interrupter further comprises a second stationary contact and a second moveable contact forming a second set of contacts, the second moveable contact positioned on a second moveable contact arm and adapted to be moved into and out of contact with the second stationary contact. The circuit interrupter also comprises a first linkage coupled to the first moveable contact arm and a second linkage coupled to the second moveable contact arm, a housing in which the first and second set of contacts and the first and second linkages are positioned, and an overcurrent measurement device coupled between with the first and second sets of contacts. The circuit interrupter is provided such that the overcurrent measurement device is adapted to actuate said first and second linkages in an overcurrent condition such that both said first and second sets of contacts are simultaneously opened during an overcurrent condition.

Other objects of the invention and its particular features and advantages will become more apparent from consideration of the following drawings and accompanying detailed description.

DETAILED DESCRIPTION OF THE INVENTION

Figure 1:
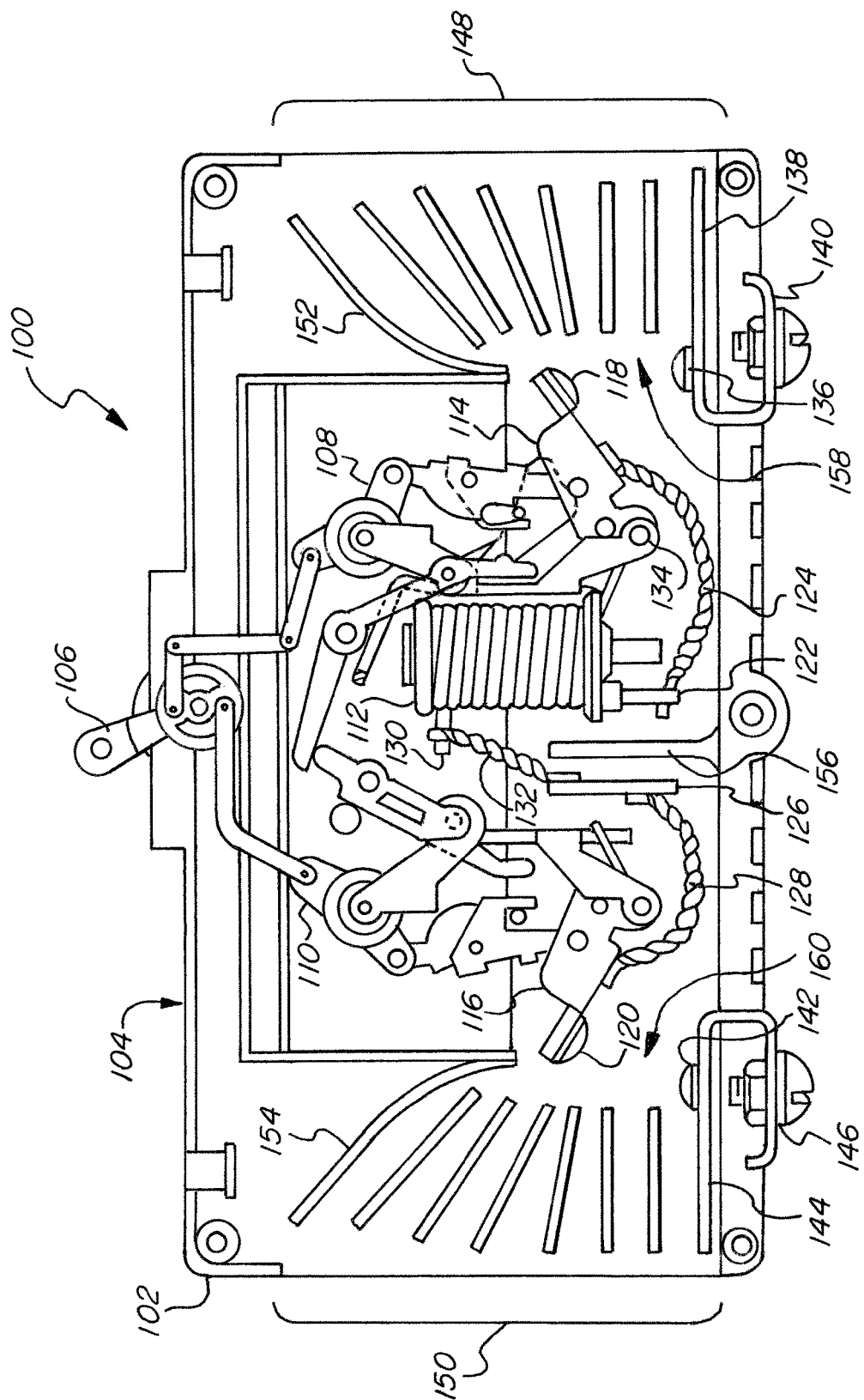
FIG. 1 is a diagram of a circuit interrupter according to one configuration.

Referring now to the drawings, wherein like reference numerals designate corresponding structure throughout the views.

FIG. 1 is a view of a circuit interrupter 100, which in one configuration, may comprise a circuit breaker. The circuit interrupter 100 is provided by a housing 102, which may comprise an insulating material, such as a thermoset polyester resin material or the like, as is commonly used in the art.

An upper surface 104 of housing 102 is includes and opening in which a handle 106 is positioned. The handle 106 is moveable to one of three positions, On, Off and Tripped. Coupled to a lower portion of handle 106 is a first linkage 108 and a second linkage 110. First linkage 108 is coupled to an overcurrent measurement device 112 and to first moveable contact arm 114. Likewise, second linkage 110 is coupled to overcurrent measurement device 112 and to second moveable contact arm 116.

A first moveable contact 118 is mounted on an underside of first moveable contact arm 114 and a second moveable contact 120 is mounted on an underside of second moveable contact arm 116.

The first moveable contact arm 114 is coupled to an input 122 of the overcurrent measurement device 112 via a first flexible conductor 124. The second moveable contact arm 116 is connected to an intermediate plate 126 by a second portion 128 of a second flexible conductor, and the intermediate plate 126 is connected to an output 130 of overcurrent measurement device 112 by a first portion 132 of the second flexible conductor.

Figure 2:
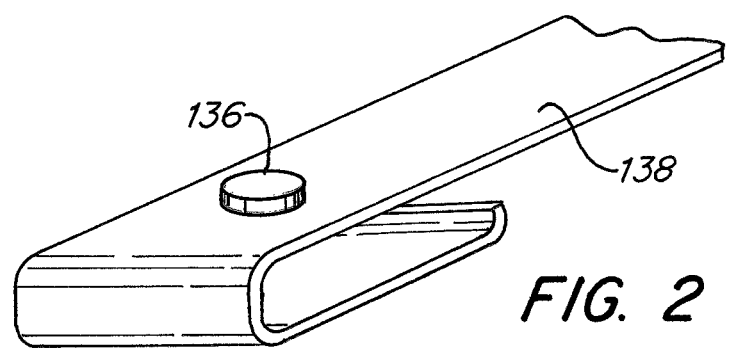
FIG. 2 is a perspective view of the first stationary contact arm and first stationary contact according to FIG. 1.

The first moveable contact 118 is generally adapted to move in a radial path defined by rotation about first pivot 134 to come into contact with first stationary contact 136. First stationary contact 136 is positioned on a first stationary contact arm 138, which is formed as a flat conductor and better illustrated in FIG. 2. First stationary contact arm 138 is provided having a U-shape configuration as seen in FIG. 1 with a lower portion providing a first terminal 140. The first terminal is illustrated as being a screw-type of connection, however, it is contemplated that virtually any type of connector can effectively be used as is known in the art, including, for example, a stab connector, tines, or the like. The first moveable contact 118 and the first stationary contact 136 form a first set of contacts 158.

The second moveable contact 120 is adapted to function in a similar manner as the first moveable contact 118. A second stationary contact 142 is positioned on a second stationary contact arm 144, which is formed as a flat conductor in a similar manner as first stationary contact arm 138. Second stationary contact arm 144 is provided having a U-shape configuration as seen in FIG. 1 with a lower portion providing a second terminal 146. The second terminal 146 may comprise any configuration as discussed in connection with first terminal 140. The second moveable contact 120 and the second stationary contact 142 form a second set of contacts 160.

Also shown in FIG. 1 is first arc extinguisher 148 and second arc extinguisher 150. First and second arc extinguishers 148, 150 each comprise a plurality of generally vertically stacked arc plates 152, 154 that are spaced apart from each other. The first arc extinguisher 148 is positioned in proximity of the first set of contacts, whereas the second arc extinguisher 150 is positioned in proximity of the second set of contacts. Each of the arc extinguishers 148, 150 are positioned such that an inner part of the arc plates 152, 154 at least partially follow the radial path of the moveable contact arm 114, 116 respectively. In this manner, in the event that an arc develops between either the first or second sets of contacts, the arc will be drawn away from the set of contacts and into the respective arc extinguisher 148, 150.

Also depicted in FIG. 1 is barrier 156, which may be integrally formed as a part of housing 102. Barrier 156 may comprise an insulating material and provide an insulating barrier between the first set of contacts and the second set of contacts, which is advantageous for high voltage environments.

Figure 3:
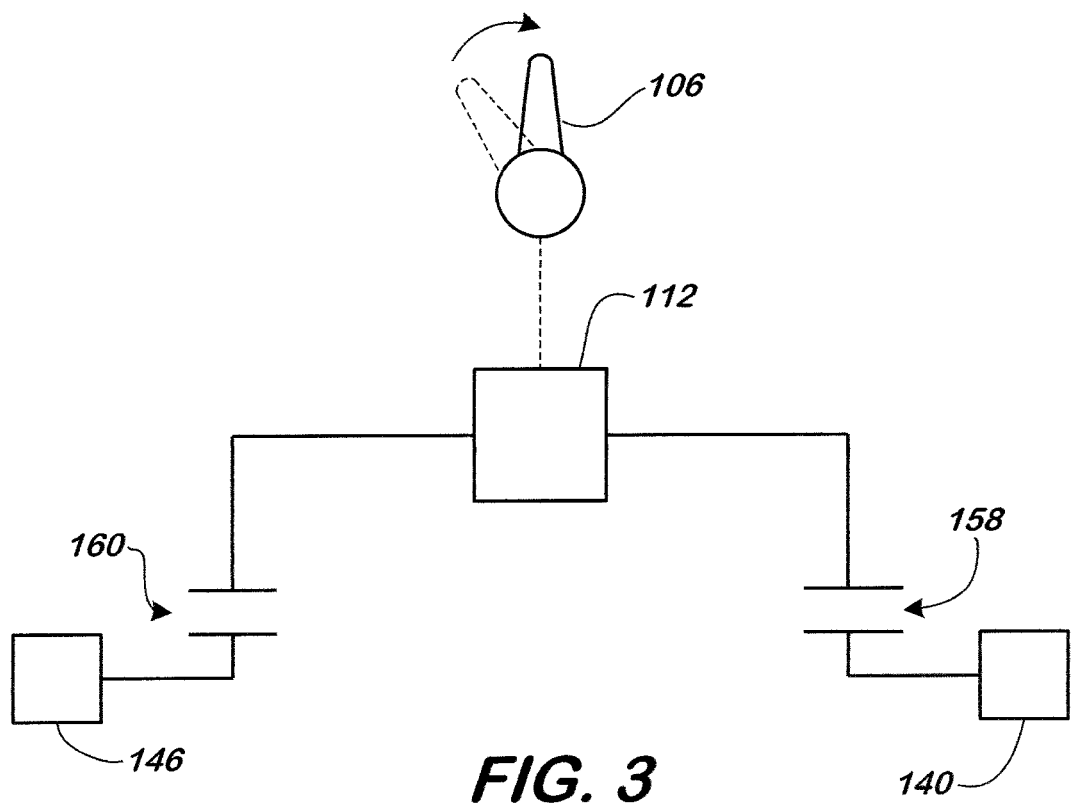
FIG. 3 is a block diagram of the functioning of the circuit interrupter according to FIG. 1 showing the handle in the Tripped position and the first and second sets of contacts open.
Figure 4:
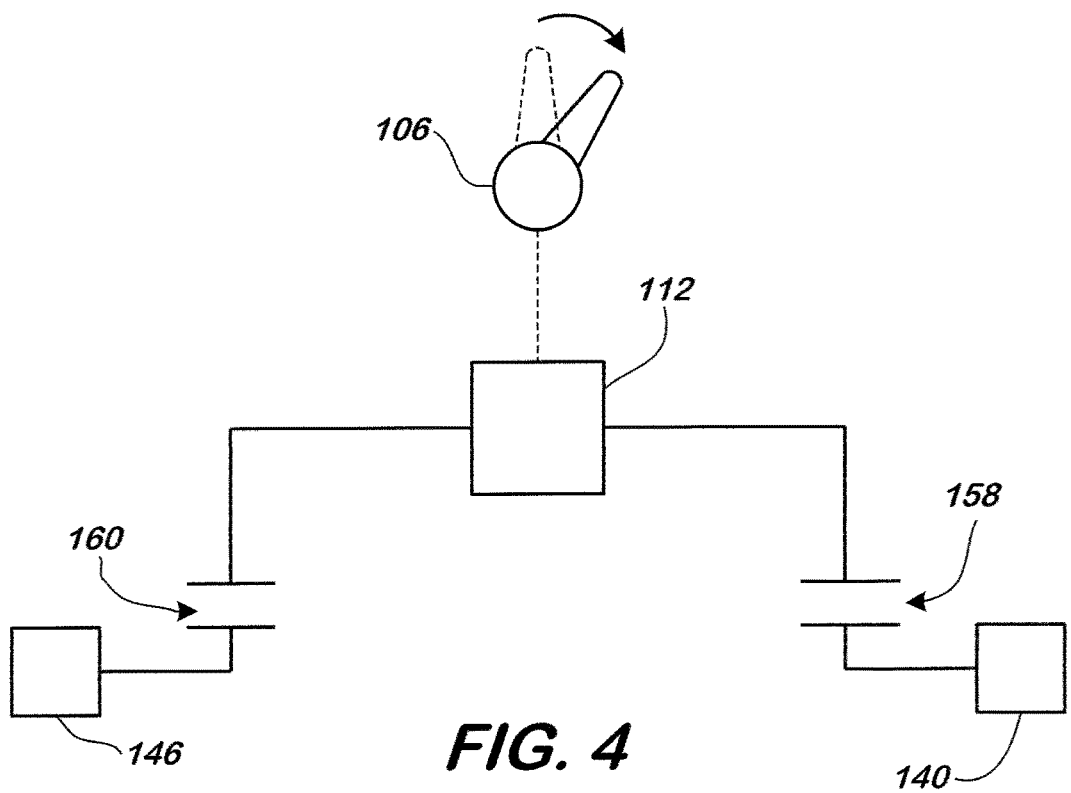
FIG. 4 is a block diagram of the functioning of the circuit interrupter according to FIG. 3 showing the handle in the Off position and the first and second sets of contacts open.
Figure 5:
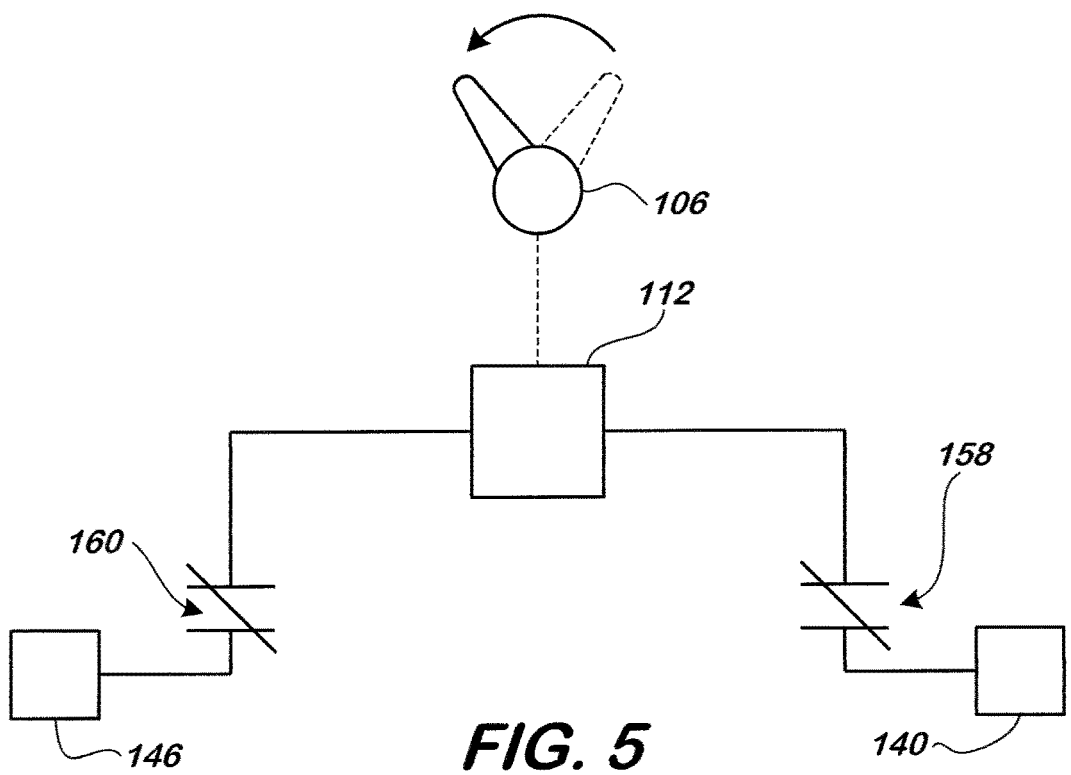
FIG. 5 is a block diagram of the functioning of the circuit interrupter according to FIG. 3 showing the handle in the On position and the first and second sets of contacts closed.

Turning now to FIGS. 3-5, functional block diagrams of circuit interrupter 100 are illustrated. FIG. 3 illustrates that in an overcurrent condition, overcurrent measurement device 112 will function to simultaneously open the first and second sets of contacts 158, 160 thereby interrupting the flow of electricity between the first and second terminals 140, 146. As can be seen, when the circuit interrupter 100 encounters and overcurrent condition, the handle 106 is toggled to the Tripped position.

In order to clear the Tripped position of the handle 106, it is illustrated in FIG. 4 that handle 106 should be moved to the Off position. This functions to "reset" the overcurrent measurement device and associated linkages. It will be noted that the first and second sets of contacts 158, 160 remain in an open state.

The handle 106 may then be moved to the On position as shown in FIG. 5, which functions to close the first and second sets of contacts 158, 160 so that the circuit interrupter 100 is then allowing electricity to pass between the first and second terminals 140, 146.

As will be seen with reference to FIGS. 1 and 3-5, the first set of contacts 158 are provided in series with the second set of contacts 160 between the first and second terminals 140, 146. In a high voltage application, this is advantageous as it means that when the sets of contacts are simultaneously opened, half of the voltage is developed across each of the sets of contacts as resistance increases during opening. This means that the arcing that occurs across the gap between each of the sets of contacts will be lessened due to the lower voltage drop.

Additionally, it should be noted that the circuit interrupter 100 is described as usable for DC high voltage applications. While DC voltage is polarity dependent as opposed to AC voltage, it will be understood by those of skill in the art that the circuit interrupter 100 can be used with the positive DC conductor connected to either the first terminal 140 or the second terminal 146. In other words, the circuit interrupter 100 can be used for polarity sensitive applications. This is due to the fact that at least one arc extinguisher will always be oriented correctly and will function to quickly extinguish any arc that develops. Since the first and second pairs of contacts 158, 160 are connected in series with each other, interruption of the flow of electricity in one set of contacts will function to interrupt the flow of electricity in the other pair of contacts effectively quenching the arc in both locations.

Although the invention has been described with reference to a particular arrangement of parts, features and the like, these are not intended to exhaust all possible arrangements or features, and indeed many other modifications and variations will be ascertainable to those of skill in the art.

What is claimed is:

1. A high voltage DC circuit interrupter comprising:
   a first stationary contact and a first moveable contact forming a first set of contacts;
   a first moveable contact arm having the first moveable contact positioned thereon, said first moveable contact adapted to be moved into and out of contact with said first stationary contact;
   a first linkage coupled to said first moveable contact arm;
   a second stationary contact and a second moveable contact forming a second set of contacts;
   a second moveable contact arm having the second moveable contact positioned thereon, said second moveable contact adapted to be moved into and out of contact with said second stationary contact;
   a second linkage coupled to said second moveable contact arm;
   an overcurrent measurement device coupled in series with said first and second sets of contacts;
   a handle coupled to said overcurrent measurement device and positioned in an upper side of a housing;
   wherein one and the same overcurrent measurement device actuates both said first and second linkages in an overcurrent condition such that both said first and second sets of contacts are simultaneously opened during any overcurrent condition.

2. The circuit interrupter according to claim 1 wherein said handle is adapted to simultaneously close said first and second sets of contacts when the handle is in an On position.

3. The circuit interrupter according to claim 1 wherein said handle is adapted to simultaneously open said first and second sets of contacts when the handle is in an Off position.

4. The circuit interrupter according to claim 1 wherein in the overcurrent condition said handle transitions to a Tripped position.

5. The circuit interrupter according to claim 1 further comprising:
   a first terminal coupled to said first stationary contact; and
   a second terminal coupled to said second stationary contact.

6. The circuit interrupter according to claim 5 further comprising:
   a first arc extinguisher; and
   a second arc extinguisher.

7. The circuit interrupter according to claim 6 wherein said first arc extinguisher is positioned in proximity to said first set of contacts and said second arc extinguisher is positioned in proximity to said second set of contacts.

8. The circuit interrupter according to claim 7,
   wherein when said first terminal is connected to a source of DC electrical power, said second terminal is adapted to be connected to a load; and
   wherein when said second terminal is connected to a source of DC electrical power, said first terminal is adapted to be connected to a load.

9. The circuit interrupter according to claim 8,
   wherein when said first terminal is connected to the source of DC electrical power, when an arc is generated between said second set of contacts, the arc is drawn into said second arc extinguisher; and
   wherein when said second terminal is connected to the source of DC electrical power, when an arc is generated between said first set of contacts, the arc is drawn into said first arc extinguisher.

10. The circuit interrupter according to claim 6 wherein said first and second arc extinguishers each comprise a plurality of arc plates.

11. The circuit interrupter according to claim 10 wherein said arc plates of said first and second arc extinguishers are positioned at least in part, along a radial path relative to a path of travel of said first and second moveable contact arms respectively.

12. The circuit interrupter according to claim 10 wherein said arc plates of said first and second arc extinguishers are vertically stacked relative to each other.

13. The circuit interrupter according to claim 12 further comprising a first stationary contact arm wherein said first stationary contact is positioned on said first stationary contact arm.

14. The circuit interrupter according to claim 13 wherein said first stationary contact arm forms a lower arc runner, which extends below said first arc extinguisher and forms a lowermost arc plate of said first arc extinguisher.

15. The circuit interrupter according to claim 14 further comprising a second stationary contact arm wherein said second stationary contact is positioned on said second stationary contact arm.

16. The circuit interrupter according to claim 15 wherein said second stationary contact arm forms a lower arc runner, which extends below said second arc extinguisher and forms a lowermost arc plate of said second arc extinguisher.

17. The circuit interrupter according to claim 16 wherein said first stationary contact arm is formed as a U-shaped arm and includes said first terminal positioned thereon.

18. The circuit interrupter according to claim 17 wherein said second stationary contact arm is formed as a U-shaped arm and includes said second terminal positioned thereon.

19. The circuit interrupter according to claim 18 wherein said first and second terminals are positioned on a side of said housing opposite of said handle.

20. The circuit interrupter according to claim 1 wherein said first moveable contact arm is coupled to an input of said overcurrent measurement device via a first flexible conductor.

21. The circuit interrupter according to claim 20 wherein an output of said overcurrent measurement device is coupled to said second moveable contact arm via a second flexible conductor.

22. The circuit interrupter according to claim 21 wherein said second moveable contact arm is coupled to an intermediate plate via a first portion of the second flexible conductor and said intermediate plate is coupled to said output of said overcurrent measurement device via a second portion of the second flexible conductor.

23. The circuit interrupter according to claim 1 further comprising:
   an insulating barrier positioned within said housing and providing an insulating barrier between said first set of contacts and said second set of contacts.

24. The circuit interrupter according to claim 23 wherein said insulating barrier is integrally formed as a part of said housing.

25. A high voltage DC circuit interrupter comprising:
   a first stationary contact and a first moveable contact forming a first set of contacts, said first moveable contact positioned on a first moveable contact arm and adapted to be moved into and out of contact with said first stationary contact;

a second stationary contact and a second moveable contact forming a second set of contacts, said second moveable contact positioned on a second moveable contact arm and adapted to be moved into and out of contact with said second stationary contact;

a first linkage coupled to said first moveable contact arm and a second linkage coupled to said second moveable contact arm;

a housing in which said first and second set of contacts and said first and second linkages are positioned;

an overcurrent measurement device coupled between with said first and second sets of contacts;

wherein one and the same overcurrent measurement device actuates both said first and second linkages in an overcurrent condition such that both said first and second sets of contacts are simultaneously opened during any overcurrent condition.

26. The circuit interrupter according to claim 25 further comprising a handle positioned in an upper side of said housing;

wherein said handle is adapted to simultaneously close said first and second sets of contacts when the handle is in an On position;

wherein said handle is adapted to simultaneously open said first and second sets of contacts when the handle is in an Off position; and wherein in the overcurrent condition said handle transitions to a Tripped position.

27. The circuit interrupter according to claim 25 further comprising, a first terminal coupled to said first stationary contact; and a second terminal coupled to said second stationary contact.

28. The circuit interrupter according to claim 27 further comprising:

a first arc extinguisher; and a second arc extinguisher, wherein said first arc extinguisher is positioned in proximity to said first set of contacts and said second arc extinguisher is positioned in proximity to said second set of contacts.

29. The circuit interrupter according to claim 28, wherein when said first terminal is connected to a source of DC electrical power, said second terminal is adapted to be connected to a load; and wherein when said second terminal is connected to a source of DC electrical power, said first terminal is adapted to be connected to a load.

30. The circuit interrupter according to claim 29, wherein when said first terminal is connected to the source of DC electrical power, when an arc is generated between said second set of contacts, the arc is drawn into said second arc extinguisher; and wherein when said second terminal is connected to the source of DC electrical power, when an arc is generated between said first set of contacts, the arc is drawn into said first arc extinguisher.

31. The circuit interrupter according to claim 28 wherein said first and second arc extinguishers each comprise a plurality of vertically stacked arc plates.

32. The circuit interrupter according to claim 31 wherein said arc plates of said first and second arc extinguishers are positioned at least in part, along a radial path relative to a path of travel of said first and second moveable contact arms respectively.

33. The circuit interrupter according to claim 32 further comprising a first stationary contact arm wherein said first stationary contact is positioned on said first stationary contact arm.

34. The circuit interrupter according to claim 33 wherein said first stationary contact arm forms a lower arc runner, which extends below said first arc extinguisher and forms a lowermost arc plate of said first arc extinguisher.

35. The circuit interrupter according to claim 34 further comprising a second stationary contact arm wherein said second stationary contact is positioned on said second stationary contact arm.

36. The circuit interrupter according to claim 35 wherein said second stationary contact arm forms a lower arc runner, which extends below said second arc extinguisher and forms a lowermost arc plate of said second arc extinguisher.

37. The circuit interrupter according to claim 36 wherein said first stationary contact arm is formed as a U-shaped arm and includes said first terminal positioned thereon.

38. The circuit interrupter according to claim 37 wherein said second stationary contact arm is formed as a U-shaped arm and includes said second terminal positioned thereon.

39. The circuit interrupter according to claim 25 wherein said first moveable contact arm is coupled to an input of said overcurrent measurement device via a first flexible conductor, and an output of said overcurrent measurement device is coupled to said second moveable contact arm via a second flexible conductor.

40. The circuit interrupter according to claim 39 wherein said second moveable contact arm is coupled to an intermediate plate via a first portion of the second flexible conductor and said intermediate plate is coupled to said output of said overcurrent measurement device via a second portion of the second flexible conductor.

41. The circuit interrupter according to claim 25 further comprising:

an insulating barrier positioned within said housing and providing an insulating barrier between said first set of contacts and said second set of contacts.

42. The circuit interrupter according to claim 41 wherein said insulating barrier is formed as an integral part of said housing.

* * * * *